United States Patent
Kabuyanagi et al.

(10) Patent No.: US 11,672,129 B2
(45) Date of Patent: Jun. 6, 2023

(54) MEMORY DEVICE

(71) Applicant: Kioxia Corporation, Minato-ku (JP)

(72) Inventors: Shoichi Kabuyanagi, Yokkaichi (JP);
Yuuichi Kamimuta, Yokkaichi (JP);
Masumi Saitoh, Yokkaichi (JP);
Marina Yamaguchi, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 200 days.

(21) Appl. No.: 17/147,695

(22) Filed: Jan. 13, 2021

(65) Prior Publication Data

US 2021/0134814 A1 May 6, 2021

Related U.S. Application Data

(62) Division of application No. 15/904,655, filed on Feb. 26, 2018, now Pat. No. 10,923,486.

(30) Foreign Application Priority Data

Sep. 21, 2017 (JP) .............................. JP2017-181223

(51) Int. Cl.
*H01L 27/115* (2017.01)
*H01L 27/11507* (2017.01)
*H01L 29/51* (2006.01)
*H01L 27/24* (2006.01)

(52) U.S. Cl.
CPC ........ *H01L 27/11507* (2013.01); *H01L 27/24* (2013.01); *H01L 29/516* (2013.01)

(58) Field of Classification Search
None
See application file for complete search history.

(56) References Cited

U.S. PATENT DOCUMENTS

| 9,761,798 B2 | 9/2017 | Kamimuta et al. |
| 9,779,797 B2 | 10/2017 | Ino et al. |
| 10,038,092 B1 | 7/2018 | Chen |
| 2010/0123176 A1 | 5/2010 | Nishimura |

(Continued)

FOREIGN PATENT DOCUMENTS

| JP | 2010-123673 | 6/2010 |
| JP | 2017-005061 | 1/2017 |

(Continued)

OTHER PUBLICATIONS

Koji Kita, et al., "Intrinsic Origin of Electric Dipoles Formed at High-k/SIO$_2$ Interface," Electron Devices Meeting 2007, IEDM 2008, pp. 29-32.

(Continued)

*Primary Examiner* — Joseph C. Nicely
*Assistant Examiner* — Lamont B Koo
(74) *Attorney, Agent, or Firm* — Oblon, McClelland, Maier & Neustadt, L.L.P.

(57) ABSTRACT

A memory device according to an embodiment includes a first conductive layer; a second conductive layer; a ferroelectric layer provided between the first conductive layer and the second conductive layer and containing hafnium oxide; a paraelectric layer provided between the first conductive layer and the ferroelectric layer and containing a first oxide; and an oxide layer provided between the paraelectric layer and the ferroelectric layer and containing a second oxide having an oxygen area density lower than an oxygen area density of the first oxide.

18 Claims, 14 Drawing Sheets

(56) References Cited

U.S. PATENT DOCUMENTS

| | | |
|---|---|---|
| 2015/0364536 A1 | 12/2015 | Bibes et al. |
| 2016/0005961 A1 | 1/2016 | Ino |
| 2016/0359109 A1 | 12/2016 | Kamimuta et al. |
| 2016/0365133 A1 | 12/2016 | Ino et al. |
| 2016/0372478 A1 | 12/2016 | Ino et al. |

FOREIGN PATENT DOCUMENTS

| | | |
|---|---|---|
| JP | 6062552 | 1/2017 |
| JP | 6096902 | 3/2017 |
| WO | WO 2015/141625 A1 | 9/2015 |

OTHER PUBLICATIONS

Y. Kamimuta, et al., "Comprehensive Study of $V_{FB}$ Shift in High-k CMOS—Dipole Formation, Fermi-level Pinning and Oxygen Vacancy Effect," Electron Devices Meeting 2007, IEDM 2007, pp. 341-344.

Shosuke Fujii, et al., "First demonstration and performance improvement of ferroelectric $HfO_2$-based resistive switch with low operation current and intrinsic diode property," VLSI Technology, 2016 IEEE Symposium, 2 Pages.

FIG.5B ON STATE (SET STATE)

FIG.5C OFF STATE (RESET STATE)

MEMORY DEVICE

CROSS-REFERENCE TO RELATED APPLICATION

This application is a division of and claims the benefit of priority under 35 U.S.C. § 120 from U.S. application Ser. No. 15/904,655 filed Feb. 26, 2018, and claims the benefit of priority under 35 U.S.C. § 119 from Japanese Patent Application No. 2017-181223 filed Sep. 21, 2017, the entire contents of each of which are incorporated herein by reference.

FIELD

Embodiments described herein relate generally to a memory device.

BACKGROUND

As a new memory device to replace a conventional flash memory, a two-terminal resistance change memory has been developed. The two-terminal resistance change memory makes a transition between a high resistance state and a low resistance state by applying a voltage between two terminals interposing a resistance change layer. For example, when the high resistance state is defined as data "0" and the low resistance state as data "1", a memory cell can store 1-bit data of "0" and "1".

A ferroelectric tunnel junction (FTJ) memory utilizing a ferroelectric material is an example of the two-terminal resistance change memory. The FTJ memory modulates the shape of the tunnel barrier by utilizing polarization inversion of the ferroelectric material and develops a high resistance state and a low resistance state. Achieving an FTJ memory with stable operation is expected.

BRIEF DESCRIPTION OF THE DRAWINGS

FIGS. 5A, 5B and 5C are illustrations of an operation principle of the FTJ memory;

DETAILED DESCRIPTION

Figure 1:
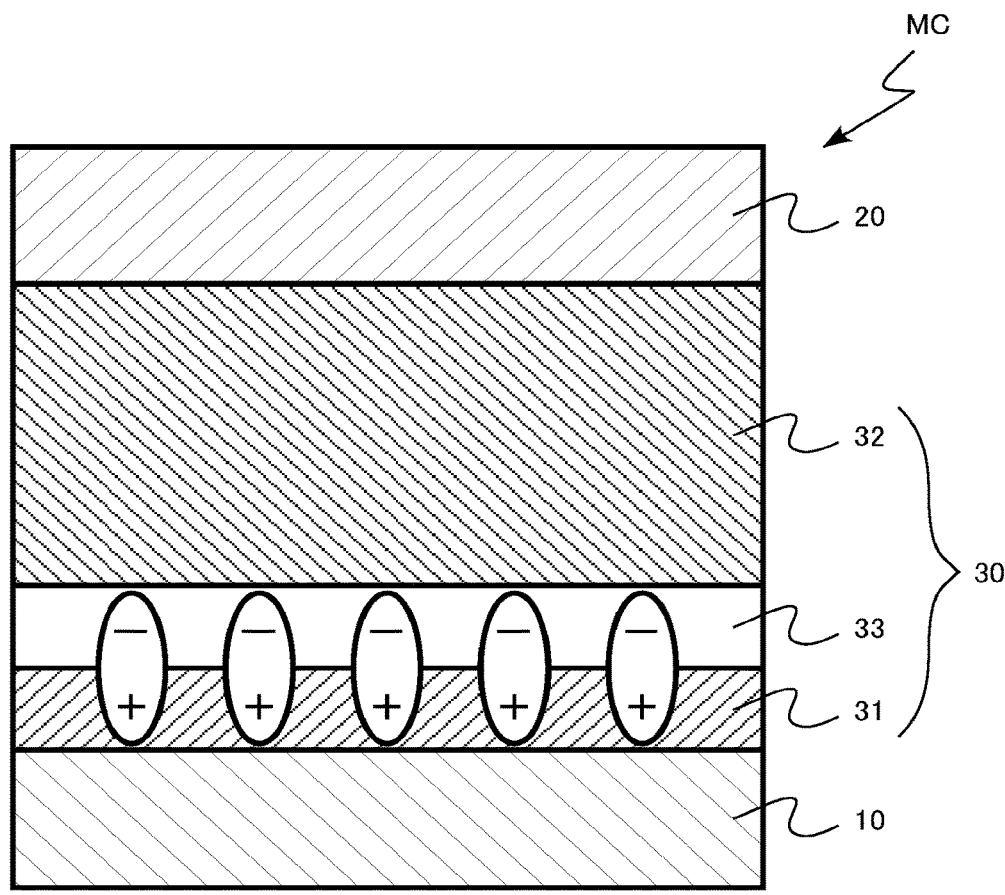
FIG. 1 is a schematic cross-sectional view of a memory cell of a memory device according to a first embodiment.

A memory device according to an embodiment includes a first conductive layer; a second conductive layer; a ferroelectric layer provided between the first conductive layer and the second conductive layer and containing hafnium oxide; a paraelectric layer provided between the first conductive layer and the ferroelectric layer and containing a first oxide; and an oxide layer provided between the paraelectric layer and the ferroelectric layer and containing a second oxide having an oxygen area density lower than an oxygen area density of the first oxide.

Hereinafter, embodiments of the present disclosure will be described with reference to the drawings. In the following description, the same or similar members or the like are denoted by the same reference numerals, and explanation of members once described is omitted as appropriate.

In the present specification, the term "upper" or "lower" may be used for the sake of convenience. The "upper" or "lower" is a term indicating a relative positional relationship within a drawing and is not a term that defines a positional relationship with respect to gravity.

The qualitative analysis and the quantitative analysis of the chemical composition of the members included in the memory device in this specification can be implemented by secondary ion mass spectroscopy (SIMS) and energy dispersive X-ray spectroscopy (EDX), for example. In addition, measurement of the thickness of the members included in the memory device, the distance between the members, or the like, can be performed using a transmission electron microscope (TEM).

First Embodiment

A memory device according to a first embodiment includes: a first conductive layer; a second conductive layer; a ferroelectric layer provided between the first conductive layer and the second conductive layer and containing hafnium oxide; a paraelectric layer provided between the first conductive layer and the ferroelectric layer and containing a first oxide; and an oxide layer provided between the paraelectric layer and the ferroelectric layer and containing a second oxide having an oxygen area density lower than an oxygen area density of the first oxide.

Figure 2:
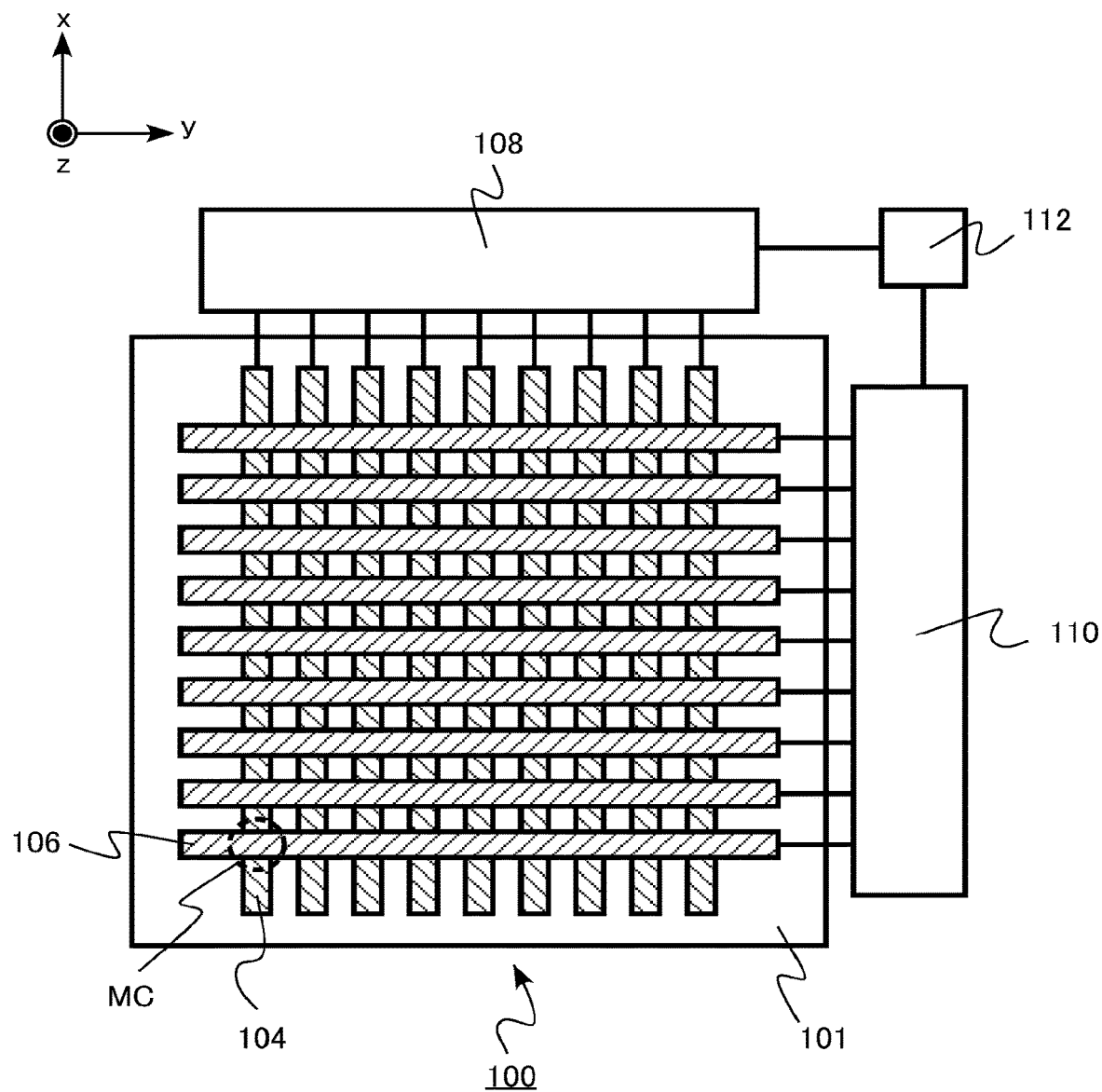
FIG. 2 is a block diagram of a memory cell array and peripheral circuits of the memory device according to the first embodiment.

FIG. 1 is a schematic cross-sectional view of a memory cell MC of a memory device according to the first embodiment. FIG. 2 is a block diagram of a memory cell array 100 and peripheral circuits of the memory device according to the first embodiment. FIG. 1 illustrates a cross section of one memory cell MC indicated by the dotted circle in the memory cell array 100 in FIG. 2, for example.

The memory cell array 100 of the memory device according to the first embodiment includes, for example, a plurality of word lines 104 and a plurality of bit lines 106 intersecting the word lines 104 on a semiconductor substrate 101 via an insulating layer. The bit line 106 is provided as a layer above the word line 104. In addition, a first control circuit 108, a second control circuit 110, and a sense circuit 112 are provided as peripheral circuits to surround the memory cell array 100.

A plurality of memory cells MC is provided in a region where the word line 104 intersects the bit line 106. The memory device according to the first embodiment is a resistance change memory having a cross-point structure. The memory cell MC is a two-terminal resistance change element.

Each of the plurality of word lines 104 is connected to the first control circuit 108. Each of the plurality of bit lines 106 is connected to the second control circuit 110. The sense circuit 112 is connected to the first control circuit 108 and the second control circuit 110.

For example, the first control circuit 108 and the second control circuit 110 include functions of selecting a desired memory cell MC, writing data to the memory cell MC, reading data from the memory cell MC, and erasing data in the memory cell MC. At the time of reading data, the data in the memory cell MC is read as the amount of current flowing between the word line 104 and the bit line 106. The sense circuit 112 has a function of determining the amount of current to judge the polarity of the data. For example, the circuit determines "0" or "1" of data. The sense circuit 112 determines the amount of tunnel current flowing through the memory cell and judges the polarity of the data.

The first control circuit 108, the second control circuit 110, and the sense circuit 112 are electronic circuits using semiconductor devices formed on the semiconductor substrate 101, for example.

As illustrated in FIG. 1, the memory cell MC includes a lower electrode 10 (first conductive layer), an upper electrode 20 (second conductive layer), and a resistance change layer 30. The resistance change layer 30 includes a paraelectric layer 31, a ferroelectric layer 32, and an oxide layer 33.

The lower electrode 10 is connected to the word line 104. The lower electrode 10 itself may be the word line 104.

The lower electrode 10 is a metal or a semiconductor, for example. The lower electrode 10 is, for example, titanium nitride (TiN), tungsten nitride (WN), tantalum nitride (TaN), tungsten (W), aluminum (Al), titanium (Ti), zirconium (Zr), hafnium (Hf), nickel (Ni), platinum (Pt), and gold (Au). The lower electrode 10 is, for example, a polycrystalline semiconductor containing a conductive impurity. The lower electrode 10 is, for example, polycrystalline silicon containing an n-type impurity or a p-type impurity. The lower electrode 10 may have a stacked structure of mutually different types of metal or of a metal and a semiconductor.

A work function of the lower electrode 10 is greater than the work function of the upper electrode 20, for example.

The upper electrode 20 is connected to the bit line 106. The upper electrode 20 itself may be the bit line 106.

The upper electrode 20 is a metal or a semiconductor, for example. The upper electrode 20 is, for example, titanium nitride (TiN), tungsten nitride (WN), tantalum nitride (TaN), tungsten (W), aluminum (Al), titanium (Ti), zirconium (Zr), hafnium (Hf) Nickel (Ni), platinum (Pt), and gold (Au). The upper electrode 20 is, for example, a polycrystalline semiconductor containing a conductive impurity. The upper electrode 20 is, for example, polycrystalline silicon containing an n-type impurity or a p-type impurity. The upper electrode 20 may have a stacked structure of mutually different types of metal or of a metal and a semiconductor.

The resistance change layer 30 is provided between the lower electrode 10 and the upper electrode 20. The resistance change layer 30 includes the paraelectric layer 31, the ferroelectric layer 32, and the oxide layer 33.

The thickness of the resistance change layer 30 is 4 nm or more and 14 nm or less, for example.

The ferroelectric layer 32 is provided between the lower electrode 10 and the upper electrode 20. The ferroelectric layer 32 contains ferroelectric hafnium oxide. The ferroelectric layer 32 contains hafnium oxide as a main component. Hafnium oxide in the ferroelectric layer 32 has a higher molar fraction than the sub-components other than hafnium oxide.

Hafnium oxide contained in the ferroelectric layer 32 includes hafnium oxide of a third orthorhombic (orthorhombic III, space group $Pbc2_1$, and space group number 29). Hafnium oxide contained in the ferroelectric layer 32 includes hafnium oxide having a crystal structure of the third orthorhombic. In other words, the hafnium oxide contained in the ferroelectric layer 32 includes third orthorhombic hafnium oxide. The hafnium oxide of the third orthorhombic has ferroelectricity. For example, the third orthorhombic has the largest proportion among the crystal structures of hafnium oxide contained in the ferroelectric layer 32.

The thickness of the ferroelectric layer 32 is 3 nm or more and 10 nm or less, for example.

The hafnium oxide contains at least one element selected from the group consisting of, for example, silicon (Si), titanium (Ti), zirconium (Zr), aluminum (Al), and yttrium (Y).

The paraelectric layer 31 is provided between the lower electrode 10 and the ferroelectric layer 32. The paraelectric layer 31 contains a paraelectric first oxide. The paraelectric layer 31 contains the first oxide as a main component. The first oxide in the paraelectric layer 31 has a higher molar fraction than the sub-component other than the first oxide.

The thickness of the paraelectric layer 31 is 0.5 nm or more and 2 nm or less, for example.

For example, the first oxide is either silicon oxide or aluminum oxide.

The oxide layer 33 is provided between the paraelectric layer 31 and the ferroelectric layer 32 (first position). The oxide layer 33 contains a paraelectric second oxide. The oxide layer 33 contains a second oxide as a main component. The second oxide in the oxide layer 33 has a higher molar fraction than the sub-component other than the second oxide.

The thickness of the oxide layer 33 is 0.5 nm or more and 2 nm or less, for example.

The second oxide has an oxygen area density lower than an oxygen area density of the first oxide. The oxygen area density of the oxide is defined as $Vu^{-2/3}$, where Vu is a volume of a unit structure per oxygen of the oxide. The volume Vu of the unit structure per oxygen of the oxide can be determined uniquely from a chemical formula quantity and density of the oxide.

For example, the oxygen area density decreases in the order of aluminum oxide, titanium oxide, zirconium oxide, hafnium oxide, magnesium oxide, silicon oxide, germanium oxide, yttrium oxide, lutetium oxide, lanthanum oxide, and strontium oxide. Among the oxides listed above, the oxygen area density of aluminum oxide is the maximum and the area density of strontium oxide is the minimum.

For example, in a case where the first oxide contained in the paraelectric layer 31 is silicon oxide, the second oxide contained in the oxide layer 33 is at least one oxide selected from the group consisting of germanium oxide, yttrium oxide, lutetium oxide, lanthanum oxide, and strontium oxide.

Since the oxygen area density of the second oxide is lower than the oxygen area density of the first oxide, the resistance change layer 30 forms a dipole (electric dipole) in which the oxide layer 33 side is negatively charged and the paraelectric layer 31 side is positively charged as illustrated in FIG. 1. In other words, the dipole is formed in the resistance change layer 30 by the oxide layer 33 such that the upper electrode 20 side is negatively charged and the lower electrode 10 side is positively charged.

Figure 3A:
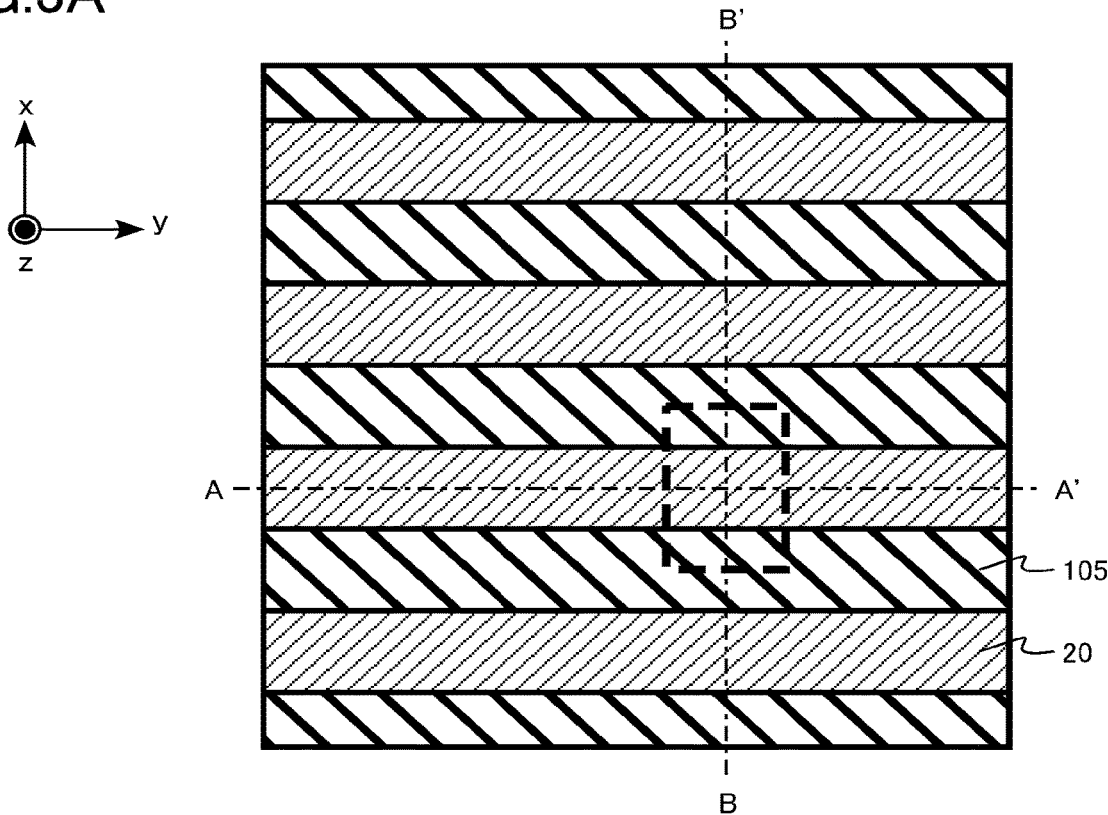
FIGS. 3A, 3B and 3C are partial schematic diagrams of the memory cell array of the memory device according to the first embodiment.
Figure 3B:
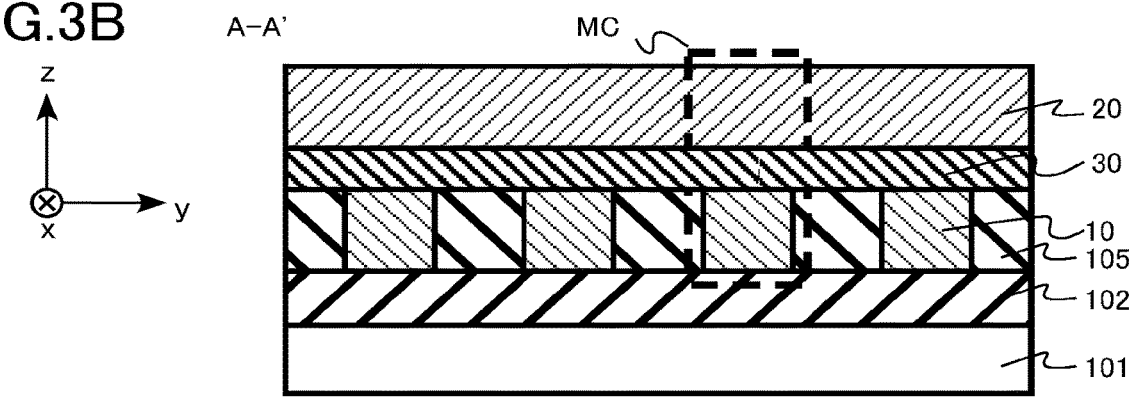
Figure 3C:
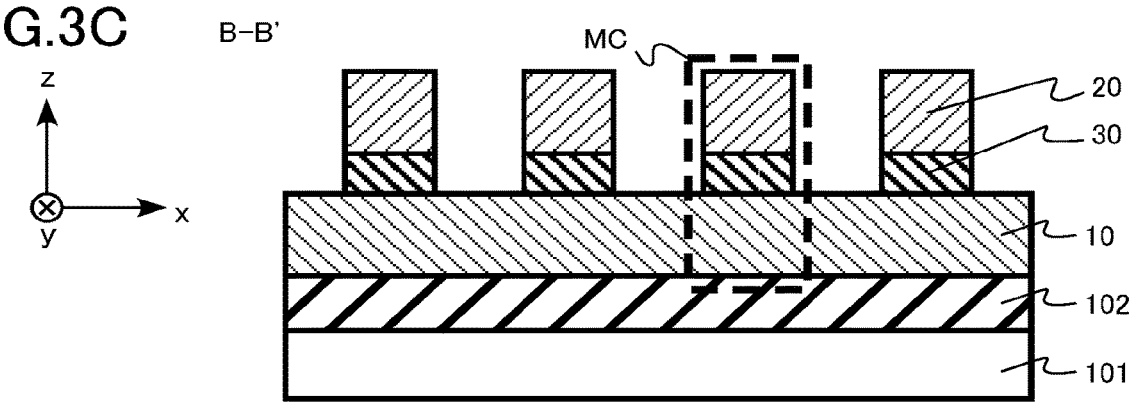

FIGS. 3A, 3B and 3C are partial schematic diagrams of the memory cell array 100 of the memory device according to the first embodiment. FIG. 3A is a top view, FIG. 3B is a cross-sectional view taken along A-A' direction of FIG. 3A, and FIG. 3C is a cross-sectional view taken along B-B' direction of FIG. 3A.

FIGS. 3A, 3B and 3C are the cases where the lower electrode 10 itself is the word line 104 and the upper electrode 20 itself is the bit line. The memory cell array 100 includes the semiconductor substrate 101, a first insulating layer 102, a second insulating layer 105, the lower electrode 10, the upper electrode 20, and the resistance change layer 30. In FIGS. 3A, 3B and 3C, the region surrounded by the broken line is one memory cell MC.

The semiconductor substrate 101 is a silicon substrate, for example. The first insulating layer 102 is provided on the semiconductor substrate 101. The first insulating layer 102 is formed of silicon oxide, for example.

The lower electrode 10 is provided on the first insulating layer 102. The lower electrode 10 extends in the x-direction. The lower electrode 10 is formed of a metal, for example. The lower electrode 10 is formed of titanium nitride, for example.

A second insulating layer 105 is provided above the first insulating layer 102 and between the lower electrodes 10. The second insulating layer 105 is formed of silicon oxide, for example.

The resistance change layer 30 and the upper electrode 20 are provided above the second insulating layer 105. The upper electrode 20 extends in the y-direction. The upper electrode 20 is formed of a metal, for example. The upper electrode 20 is formed of titanium nitride, for example.

The resistance change layer 30 is provided between the second insulating layer 105 and the upper electrode 20. A portion of the resistance change layer 30 is provided between the lower electrode 10 and the upper electrode 20.

Hereinafter, functions and effects of the first embodiment will be described.

First, an operation principle of the FTJ memory will be described with reference to a memory device according to a comparative example as an example.

Figure 4:
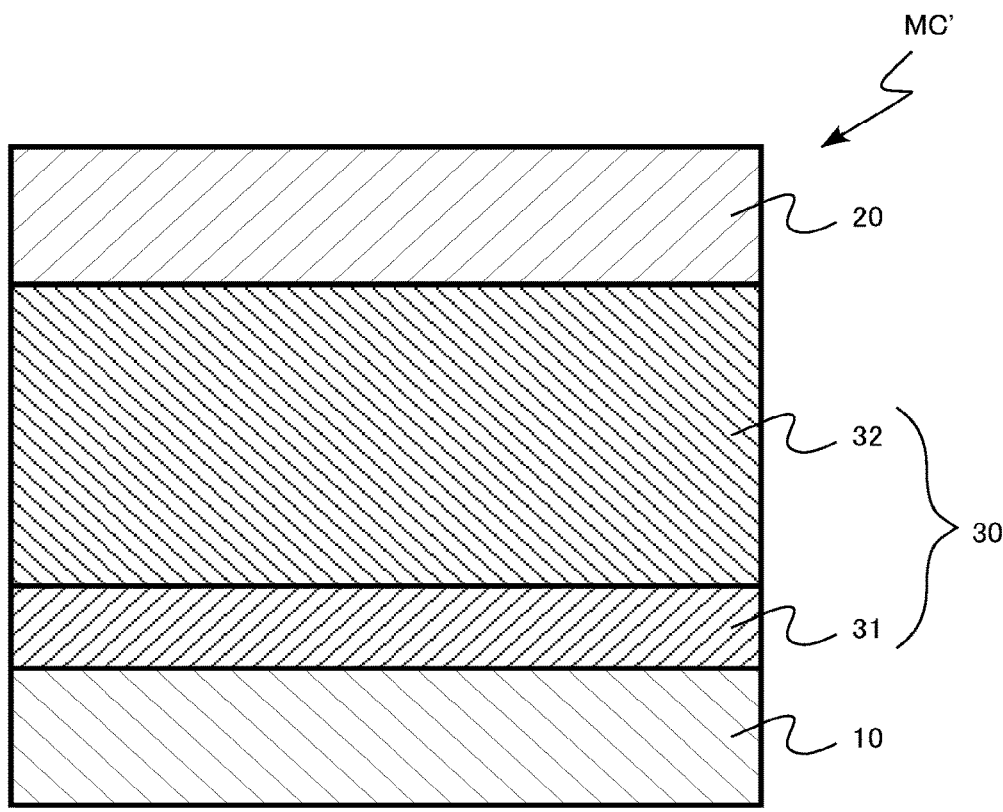
FIG. 4 is a schematic cross-sectional view of a memory cell of a memory device of a comparative example.

FIG. 4 is a schematic cross-sectional view of a memory cell MC' of the memory device according to the comparative example. As illustrated in FIG. 4, the memory cell MC' of the comparative example includes the lower electrode 10, the upper electrode 20, and the resistance change layer 30. The resistance change layer 30 includes the paraelectric layer 31 and the ferroelectric layer 32. The memory device of the comparative example is different from the first embodiment in that the resistance change layer 30 is formed of the paraelectric layer 31 and the ferroelectric layer 32 and does not include an oxide layer.

Figure 5A:
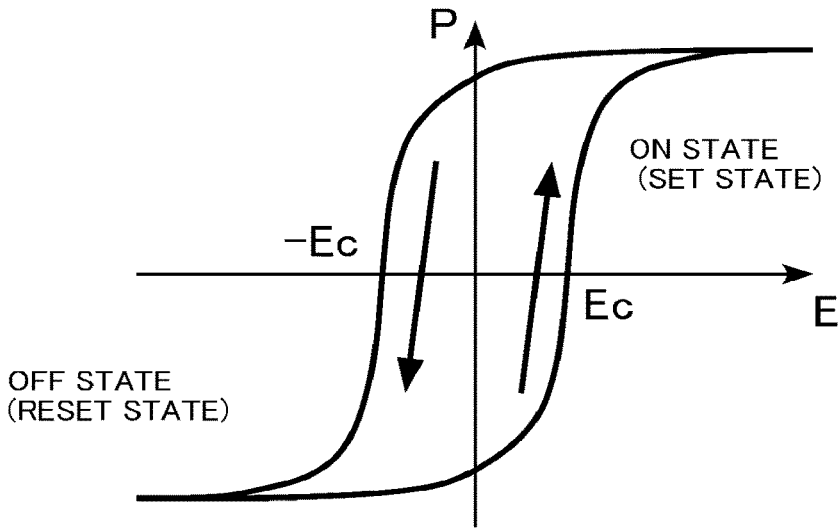
Figure 5A:
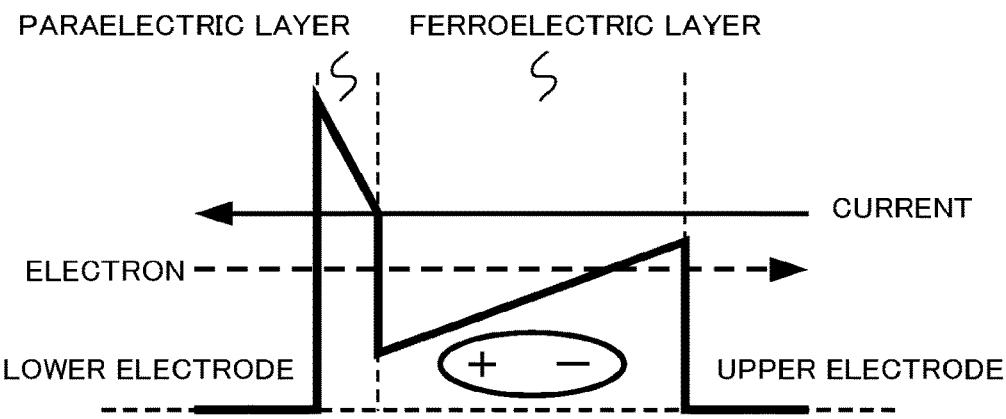
Figure 5A:
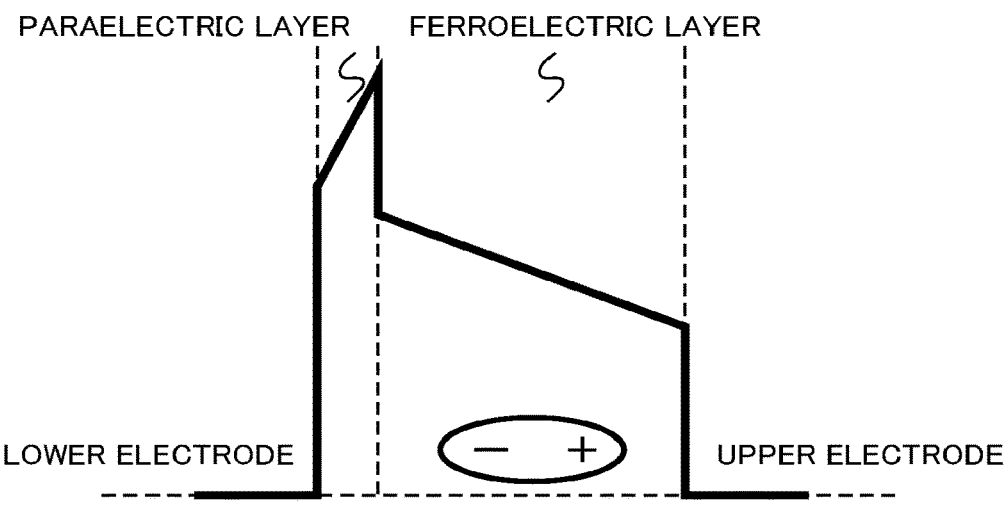

FIGS. 5A, 5B and 5C are illustrations of an operation principle of an FTJ memory. FIG. 5A illustrates a polarization (P)-electric field (E) characteristic (hereinafter also described as the P-E characteristic) of the FTJ memory. FIG. 5B is a band diagram when the FTJ memory is in the on state (set state), and FIG. 5C is a band diagram when the FTJ memory is in the off state (reset state). The band diagrams of FIG. 5B and FIG. 5C illustrate a case where the voltage applied to the upper electrode 20 and the lower electrode 10 is 0 V.

In FIG. 5A, the horizontal axis represents the electric field (E) applied to the resistance change layer 30, and the vertical axis represents the polarization (P) of the ferroelectric layer 32. The positive direction on the horizontal axis is the case where a positive voltage is applied to the upper electrode 20 side and a negative voltage is applied to the lower electrode 10 side.

With a change in the electric field applied to the resistance change layer 30, polarization inversion of the ferroelectric layer 32 occurs. Polarization inversion occurs at a coercive field (Ec) on the positive side and a coercive field (Ec') on the negative side. In the FTJ memory of the comparative example, the coercive field (Ec) on the positive side and the coercive field (Ec') on the negative side are substantially the same, exhibiting a bilaterally symmetrical P-E characteristic. Herein, the magnitude of the negative side coercive field (Ec') indicates the magnitude of the absolute value.

As illustrated in FIG. 5B, in the on state (set state), the ferroelectric layer 32 is polarized to cause the upper electrode 20 side to be negatively charged and the lower electrode 10 side to be positively charged. For example, when a positive voltage is applied to the upper electrode 20 in the on state, a tunnel current flows from the upper electrode 20 to the lower electrode 10 as illustrated by the solid line in the figure. The electron flows in the direction opposite to the current as indicated by the dotted line.

As illustrated in FIG. 5C, in the off state (reset state), the ferroelectric layer 32 is polarized to allow the upper electrode 20 side to be positively charged and the lower electrode 10 side to be negatively charged. The shape of the tunnel barrier is modulated from the on state, effectively increasing the tunnel barrier. Therefore, for example, in the off state, no current flows even when a positive voltage is applied to the upper electrode 20.

The on state corresponds to a low resistance state, and the off state corresponds to a high resistance state. For example, when the high resistance state is defined as data "0" and the low resistance state as data "1", the memory cell MC' can store 1-bit data of "0" and "1".

The voltage applied between the upper electrode 20 and the lower electrode 10 to switch from the off state to the on state is referred to as a set voltage (Vset), while the voltage applied between the upper electrode 20 and the lower electrode 10 to switch from the on state to the off state is referred to as a reset voltage (Vreset). With the upper electrode 20 side being defined as a positive side and the lower electrode 10 side being a negative side, the set voltage is a positive voltage and the reset voltage is a negative voltage.

For example, in a case where the resistance change layer 30 is thinned, etc., to increase the on-current of the FTJ memory according to the comparative example, a failure mode causing breakdown of the memory cell MC' at application of a set voltage might emerge. To cope with this, it is desirable to reduce the set voltage in order to suppress the breakdown of the memory cell MC'.

Decreasing the coercive field (Ec) on the positive side decreases the set voltage while increasing the coercive field on the positive side (Ec) increases the set voltage. In contrast, decreasing the coercive field (Ec') on the negative side decreases the reset voltage, while increasing the coercive field on the negative side (Ec') increases the reset voltage.

For example, when the reset voltage is decreased, the transition from the on state to the off state is more likely to occur. This degrades retention characteristics in the on state. Particularly in the FTJ memory, the retention characteristics in the on state tend to be more degraded than the retention characteristics in the off state, and thus, it is desirable to avoid a decrease in the reset voltage from the viewpoint of retention characteristics.

Reducing both the coercive field (Ec) on the positive side and the coercive field on the negative side (Ec') would decrease the set voltage and suppress the breakdown of the memory cell MC'. On the other hand, this would increase the reset voltage and thus degrade retention characteristics in the on state.

Figure 6:
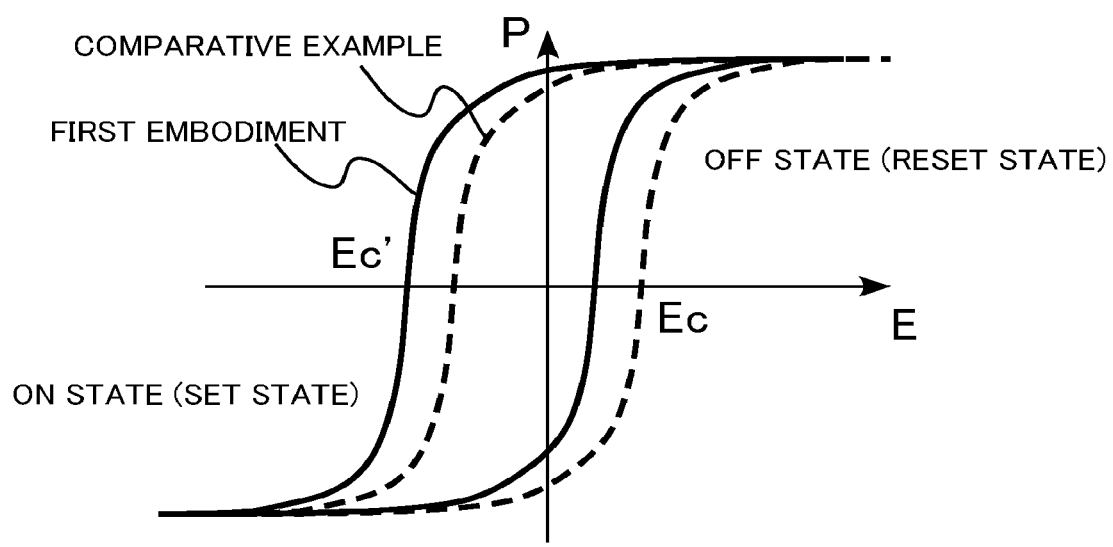
FIG. 6 is an illustration of a function and an effect of the memory device according to the first embodiment.

FIG. 6 is an illustration of a function and an effect of the memory device according to the first embodiment. FIG. 6 is a diagram illustrating a P-E characteristic of the FTJ memory according to the first embodiment. The solid line is the P-E characteristic of the FTJ memory according to the first embodiment, while the dotted line is the P-E characteristic of the FTJ memory according to the comparative example.

As compared with the FTJ memory of the comparative example, the FTJ memory according to the first embodiment has a smaller coercive field (Ec) on the positive side and a greater coercive field (Ec') on the negative side. In other words, the P-E characteristic is shifted to the negative side (left side) compared with the P-E characteristic of the FTJ memory of the comparative example. In other words, the P-E characteristic is asymmetric with respect to the case where E=0 as a reference.

With the FTJ memory according to the first embodiment, the decreased coercive field (Ec) on the positive side decreases the set voltage, leading to suppression of the breakdown of the memory cell MC. Additionally, the coercive field (Ec') on the negative side increases to increase the reset voltage, leading to enhancement in the retention characteristic in the on state. This makes it possible to suppress the breakdown of the memory cell MC and enhance the retention characteristic in the on state at the same time.

The reason of the decrease in the coercive field (Ec) on the positive side and the increase in the coercive field (Ec') on the negative side in the FTJ memory according to the first embodiment is considered as follows.

Figure 7:
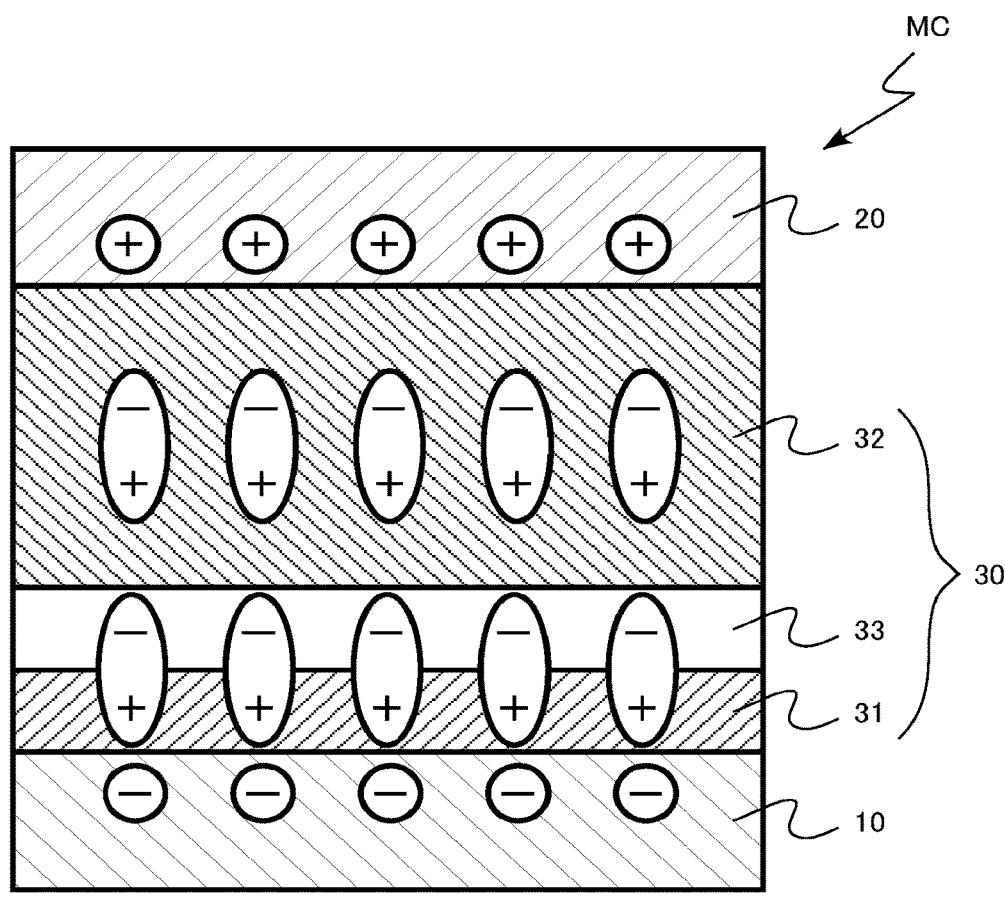
FIG. 7 is an illustration of a function and an effect of the memory device according to the first embodiment.

FIG. 7 is an illustration of a function and an effect of the memory device according to the first embodiment. FIG. 7 illustrates a polarization direction of the ferroelectric layer 32 of the memory cell MC in the on state (set state), the direction of the dipole formed by the oxide layer 33, and the polarity of the charge in the electrode, induced by the dipole formed by the oxide layer 33. FIG. 7 illustrates a case where the voltage applied to the upper electrode 20 and the lower electrode 10 is 0 V.

In the FTJ memory according to the first embodiment, the oxide layer 33 is provided in the resistance change layer 30 of the memory cell MC to form a dipole in which the oxide layer 33 side is negatively charged and the paraelectric layer 31 side is positively charged. The electric field formed by the dipole functions to stabilize the polarization direction of the ferroelectric layer 32.

The dipole is considered to be formed due to the following reason. The second oxide contained in the oxide layer 33 has an oxygen area density lower than the oxygen area density of the first oxide contained in the paraelectric layer 31. This causes the oxygen to move from the paraelectric layer 31 having a large oxygen area density to the oxide layer 33 as oxygen ions to form oxygen vacancies in the paraelectric layer 31. Oxygen ions are negatively charged and oxygen vacancies are positively charged. This forms a dipole negatively charged on the oxide layer 33 side and positively charged on the paraelectric layer 31 side at an interface between the paraelectric layer 31 and the oxide layer 33.

Moreover, this dipole induces a positive charge to the upper electrode 20 and a negative charge to the lower electrode 10. The electric field formed by the charges induced to the upper electrode 20 and the lower electrode 10 also functions to stabilize the polarization direction of the ferroelectric layer 32.

Both the electric field formed by the dipole and the electric field formed by the charges induced in the upper electrode 20 and the lower electrode 10 also function to stabilize the polarization direction of the ferroelectric layer 32 in the on state. In other words, both the electric field formed by the dipole and the electric field formed by the charges induced in the upper electrode 20 and the lower electrode 10 function to destabilize the polarization direction of the ferroelectric layer 32 in the off state.

Therefore, the polarization direction of the ferroelectric layer 32 in the on state is easily developed, and the polarization direction in the on state is easily retained. This decreases the coercive field (Ec) on the positive side and decreases the set voltage. This also increases the coercive field (Ec') on the negative side and increases the reset voltage.

It is preferable that the first oxide contained in the paraelectric layer 31 be either silicon oxide or aluminum oxide from the viewpoint of their adaptability to the manufacturing process of an existing semiconductor device. From the viewpoint of developing a stable dipole, it is preferable that the first oxide be silicon oxide.

The thickness of the oxide layer 33 is preferably 0.5 nm or more and 2 nm or less, and more preferably 0.5 nm or more and 1 nm or less. Below the above range, it might be difficult to form a stable dipole. On the other hand, exceeding the above-described range might decrease the on-current.

The thickness of the paraelectric layer 31 is preferably 0.5 nm or more and 2 nm or less, and more preferably 0.5 nm or more and 1 nm or less. Below the above range, suppression of the leakage current in the off state might be insufficient. On the other hand, exceeding the above-described range might decrease the on-current.

The thickness of the ferroelectric layer 32 is preferably 3 nm or more and 10 nm or less, and more preferably 4 nm or more and 8 nm or less. Below the above range, modulation of the shape of the tunnel barrier might be insufficient. On the other hand, exceeding the above-described range might decrease the on-current.

The hafnium oxide contained in the ferroelectric layer 32 preferably contains at least one element selected from the group consisting of silicon (Si), titanium (Ti), zirconium (Zr), aluminum (Al), and yttrium (Y), for example. Containing the above-described element(s) would develop ferroelectricity easily.

It is preferable that the work function of the lower electrode 10 be greater than the work function of the upper electrode 20. Setting the work function of the lower electrode 10 to be greater than the work function of the upper electrode 20, it is possible to further decrease the set voltage and increase the reset voltage.

For example, the work function increases in the order of hafnium (Hf), zirconium (Zr), titanium (Ti), aluminum (Al), titanium nitride (TiN), gold (Au), nickel (Ni), and platinum (Pt). For example, it is possible to select, from the materials listed above, the material such that the work function of the lower electrode 10 becomes greater than the work function of the upper electrode 20.

From the viewpoint of suppressing oxidation of the electrode, the lower electrode 10 or the upper electrode 20 is preferably formed of a metal nitride. The lower electrode 10 or the upper electrode 20 is preferably formed of titanium nitride (TiN), tungsten nitride (WN), or tantalum nitride (TaN), for example.

As described above, according to the first embodiment, the oxide layer 33 is provided in the resistance change layer 30 to form the dipole, making it possible to decrease the set voltage of the FTJ memory and increase the reset voltage. This makes it possible to suppress the breakdown of the memory cell MC and enhance the retention characteristic in the on state at the same time. This can achieve an FTJ memory with stable operation.

Second Embodiment

A memory device according to a second embodiment includes: a first conductive layer; a second conductive layer; a ferroelectric layer provided between the first conductive layer and the second conductive layer and containing hafnium oxide; a paraelectric layer provided between the first conductive layer and the ferroelectric layer and containing a first oxide; and an oxide layer provided between the ferroelectric layer and the second conductive layer and containing a second oxide having an oxygen area density lower than an oxygen area density of the hafnium oxide. In the memory device of the second embodiment, the oxide layer is provided at a position different from the position in the first embodiment. Accordingly, the description overlapping with the first embodiment will be partly omitted.

Figure 8:
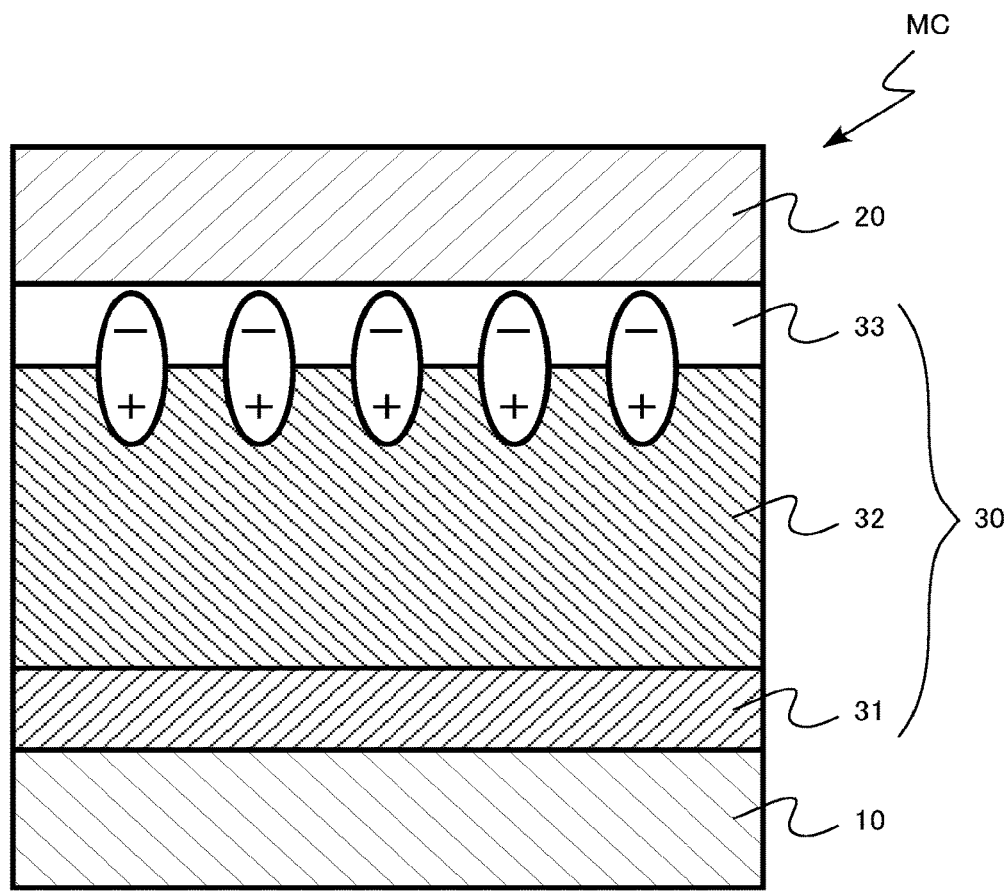
FIG. 8 is a schematic cross-sectional view of a memory cell of a memory device according to a second embodiment.

FIG. 8 is a schematic cross-sectional view of the memory cell MC of the memory device according to the second embodiment. As illustrated in FIG. 8, the memory cell MC includes the lower electrode 10 (first conductive layer), the upper electrode 20 (second conductive layer), and the resistance change layer 30. The resistance change layer 30 includes the paraelectric layer 31, the ferroelectric layer 32, and the oxide layer 33.

The oxide layer 33 is provided between the ferroelectric layer 32 and the upper electrode 20 (second position). The oxide layer 33 contains a paraelectric second oxide. The oxide layer 33 contains a second oxide as a main component. The second oxide in the oxide layer 33 has a higher molar fraction than the sub-component other than the second oxide.

The thickness of the oxide layer 33 is 0.5 nm or more and 2 nm or less, for example.

The second oxide has an oxygen area density lower than an oxygen area density of hafnium oxide. The oxygen area density of the oxide is defined as $Vu^{-2/3}$, where Vu is a volume of a unit structure per oxygen of the oxide. The volume Vu of the unit structure per oxygen of the oxide can be determined uniquely from a chemical formula quantity and density of the oxide.

For example, the oxygen area density decreases in the order of aluminum oxide, titanium oxide, zirconium oxide, hafnium oxide, magnesium oxide, silicon oxide, germanium oxide, yttrium oxide, lutetium oxide, lanthanum oxide, and strontium oxide. Among the oxides listed above, the oxygen area density of aluminum oxide is the maximum and the area density of strontium oxide is the minimum.

For example, the second oxide contained in the oxide layer 33 is at least one oxide selected from the group consisting of magnesium oxide, silicon oxide, germanium oxide, yttrium oxide, lutetium oxide, lanthanum oxide, and strontium oxide.

Since the oxygen area density of the second oxide is lower than the oxygen area density of the hafnium oxide, the resistance change layer 30 forms a dipole in which the oxide layer 33 side is negatively charged and the ferroelectric layer 32 side is positively charged as illustrated in FIG. 8. In other words, the dipole is formed in the resistance change layer 30 by the oxide layer 33 such that the upper electrode 20 side is negatively charged and the lower electrode 10 side is positively charged.

Figure 9:
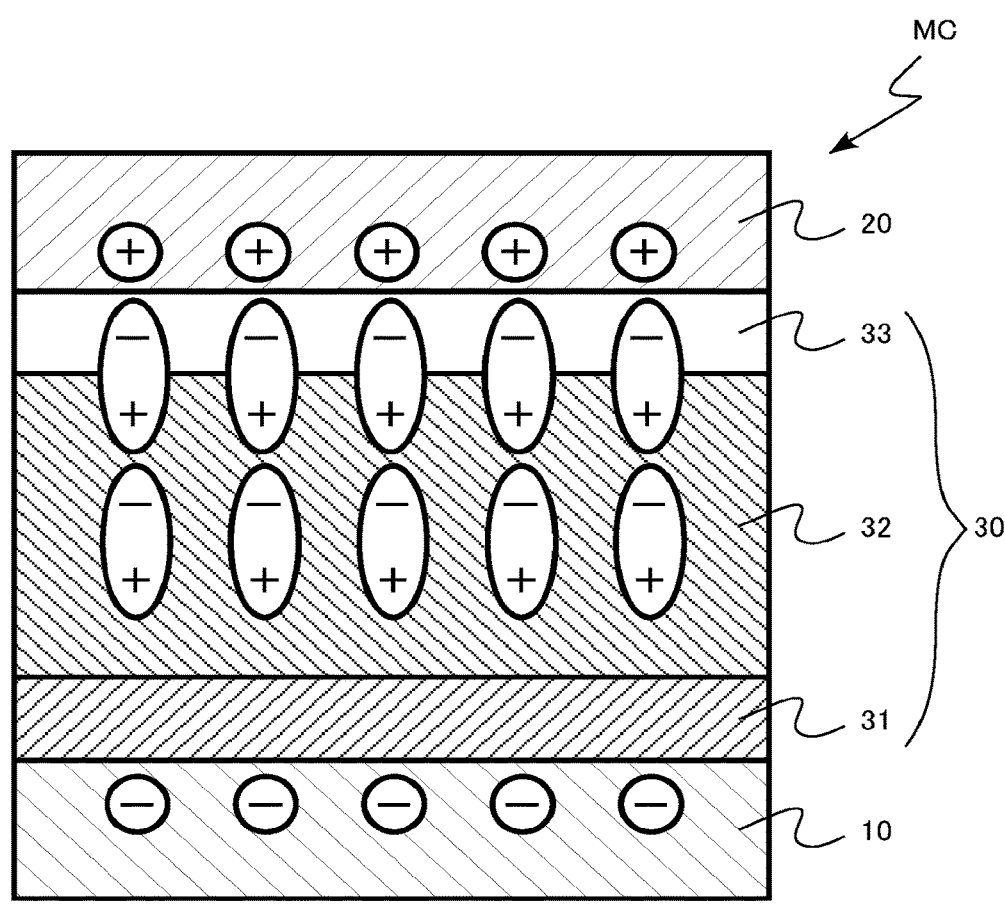
FIG. 9 is an illustration of a function and an effect of the memory device according to the second embodiment.

FIG. 9 is an illustration of a function and an effect of the memory device according to the second embodiment. FIG. 9 illustrates a polarization direction of the ferroelectric layer 32 of the memory cell MC in the on state (set state), the direction of the dipole formed by the oxide layer 33, and the polarity of the charge in the electrode, induced by the dipole formed by the oxide layer 33. FIG. 9 illustrates a case where the voltage applied to the upper electrode 20 and the lower electrode 10 is 0 V.

In the FTJ memory according to the second embodiment, the oxide layer 33 is formed in the resistance change layer 30 of the memory cell MC to form a dipole in which the oxide layer 33 side is negatively charged and the ferroelectric layer 32 side is positively charged. The electric field formed by the dipole functions to stabilize the polarization direction of the ferroelectric layer 32.

The dipole is considered to be formed due to the following reason. The second oxide contained in the oxide layer 33 has an oxygen area density lower than the oxygen area density of hafnium oxide contained in the ferroelectric layer 32. This causes the oxygen to move from the ferroelectric layer 32 having a high oxygen area density to the oxide layer 33 as oxygen ions to form oxygen vacancies in the ferroelectric layer 32. Oxygen ions are negatively charged and oxygen vacancies are positively charged. This forms a dipole negatively charged on the oxide layer 33 side and positively charged on the ferroelectric layer 32 side at an interface between the ferroelectric layer 32 and the oxide layer 33.

Moreover, this dipole induces a positive charge to the upper electrode 20 and a negative charge to the lower electrode 10. The electric field formed by the charges induced to the upper electrode 20 and the lower electrode 10 also functions to stabilize the polarization direction of the ferroelectric layer 32.

Both the electric field formed by the dipole and the electric field formed by the charges induced in the upper electrode 20 and the lower electrode 10 also function to stabilize the polarization direction of the ferroelectric layer 32 in the on state. In other words, both the electric field formed by the dipole and the electric field formed by the charges induced in the upper electrode 20 and the lower electrode 10 function to destabilize the polarization direction of the ferroelectric layer 32 in the off state.

Therefore, the polarization direction of the ferroelectric layer 32 in the on state is easily developed, and the polarization direction in the on state is easily retained. This decreases the coercive field (Ec) on the positive side and decreases the set voltage. This also increases the coercive field (Ec') on the negative side and increases the reset voltage.

As described above, according to the second embodiment, the oxide layer 33 is provided in the resistance change layer 30 to form the dipole, making it possible to decrease the set voltage of the FTJ memory and increase the reset voltage, similarly to the first embodiment. This makes it possible to suppress the breakdown of the memory cell MC and enhance the retention characteristic in the on state at the same time. This can achieve an FTJ memory with stable operation.

Third Embodiment

A memory device according to a third embodiment includes: a first conductive layer; a second conductive layer; a ferroelectric layer provided between the first conductive layer and the second conductive layer and containing hafnium oxide; a paraelectric layer provided between the first conductive layer and the ferroelectric layer and containing a first oxide; and an oxide layer provided between the first conductive layer and the paraelectric layer and containing a second oxide having an oxygen area density higher than an oxygen area density of the first oxide. In the memory device of the third embodiment, the oxide layer is provided at a position different from the position in the first embodiment. Accordingly, the description overlapping with the first embodiment will be partly omitted.

Figure 10:
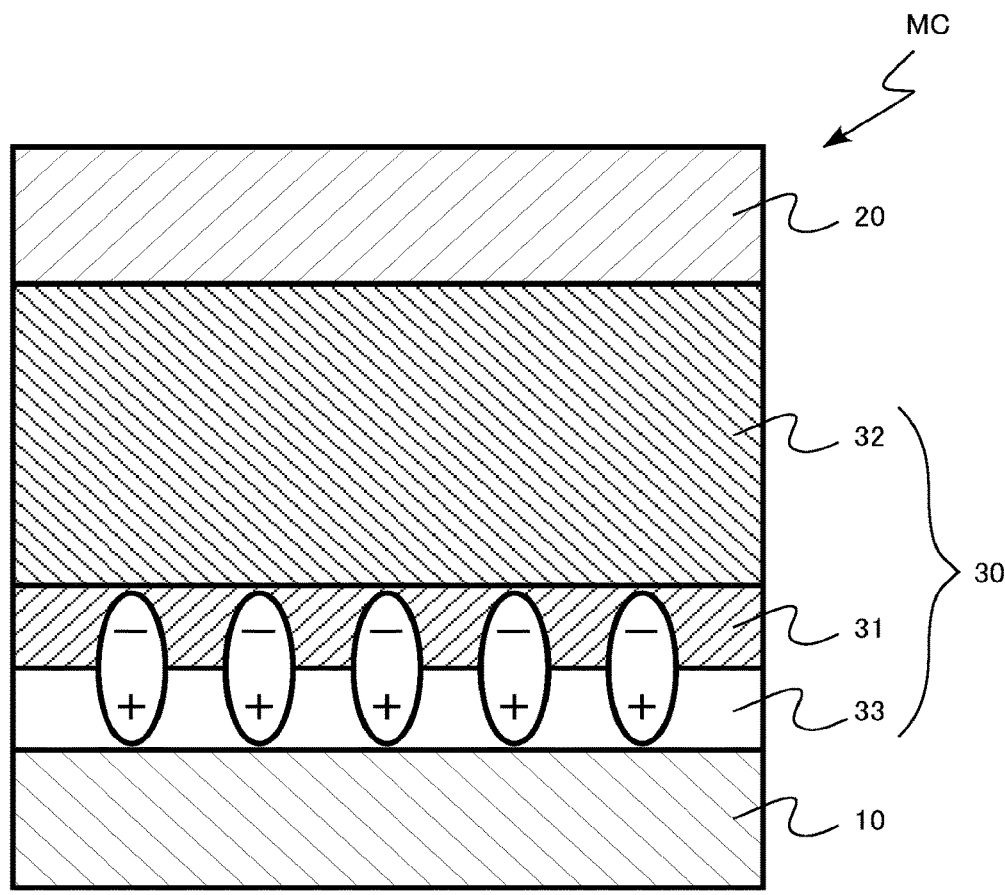
FIG. 10 is a schematic cross-sectional view of a memory cell of a memory device according to a third embodiment.

FIG. 10 is a schematic cross-sectional view of the memory cell MC of the memory device according to the third embodiment. As illustrated in FIG. 10, the memory cell MC includes the lower electrode 10 (first conductive layer), the upper electrode 20 (second conductive layer), and the resistance change layer 30. The resistance change layer 30 includes the paraelectric layer 31, the ferroelectric layer 32, and the oxide layer 33.

The oxide layer 33 is provided between the lower electrode 10 and the paraelectric layer 31 (third position). The oxide layer 33 contains a paraelectric second oxide. The oxide layer 33 contains a second oxide as a main component. The second oxide in the oxide layer 33 has a higher molar fraction than the sub-component other than the second oxide.

The thickness of the oxide layer 33 is 0.5 nm or more and 2 nm or less, for example.

The second oxide has a higher oxygen area density than the first oxide. The oxygen area density of the oxide is defined as $Vu^{-2/3}$, where Vu is a volume of a unit structure per oxygen of the oxide. The volume Vu of the unit structure per oxygen of the oxide can be determined uniquely from a chemical formula quantity and density of the oxide.

For example, the oxygen area density decreases in the order of aluminum oxide, titanium oxide, zirconium oxide, hafnium oxide, magnesium oxide, silicon oxide, germanium oxide, yttrium oxide, lutetium oxide, lanthanum oxide, and strontium oxide. Among the oxides listed above, the oxygen area density of aluminum oxide is the maximum and the area density of strontium oxide is the minimum.

For example, in a case where the first oxide contained in the paraelectric layer 31 is silicon oxide, the second oxide contained in the oxide layer 33 is at least one oxide selected from the group consisting of aluminum oxide, titanium oxide, zirconium oxide, hafnium oxide, and magnesium oxide.

Since the oxygen area density of the second oxide is higher than the oxygen area density of the first oxide, the resistance change layer 30 includes a dipole in which the paraelectric layer 31 side is negatively charged and the oxide layer 33 side is positively charged as illustrated in FIG. 10. In other words, the dipole is formed in the resistance change layer 30 by the oxide layer 33 such that the upper electrode 20 side is negatively charged and the lower electrode 10 side is positively charged.

Figure 11:
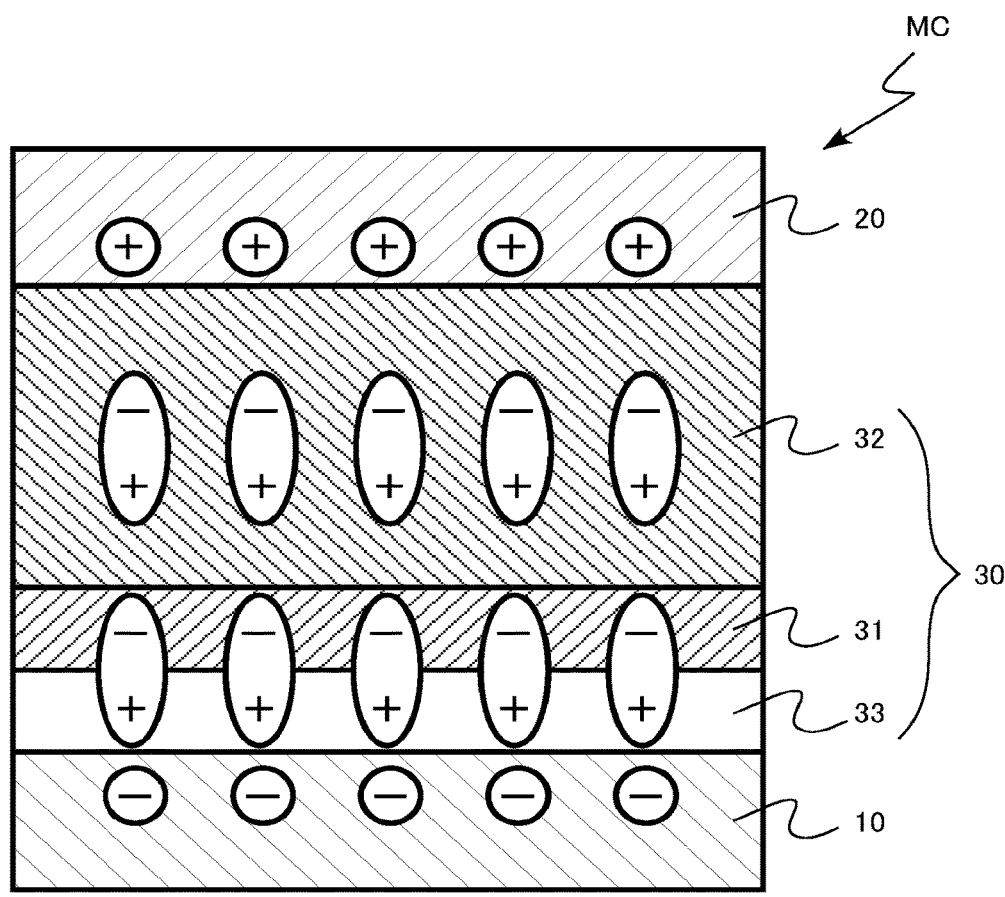
FIG. 11 is an illustration of a function and an effect of the memory device according to the third embodiment.

FIG. 11 is an illustration of a function and an effect of the memory device according to the third embodiment. FIG. 11 illustrates a polarization direction of the ferroelectric layer 32 of the memory cell MC in the on state (set state), the direction of the dipole formed by the oxide layer 33, and the polarity of the charge in the electrode, induced by the dipole formed by the oxide layer 33. FIG. 11 illustrates a case where the voltage applied to the upper electrode 20 and the lower electrode 10 is 0 V.

In the FTJ memory according to the third embodiment, the oxide layer 33 is provided in the resistance change layer 30 of the memory cell MC to form a dipole in which the paraelectric layer 31 side is negatively charged and the oxide layer 33 side is positively charged. The electric field formed by the dipole functions to stabilize the polarization direction of the ferroelectric layer 32.

The dipole is considered to be formed due to the following reason. The second oxide contained in the oxide layer 33 has an oxygen area density higher than the oxygen area density of the first oxide contained in the paraelectric layer 31. This causes the oxygen to move from the oxide layer 33 having a high oxygen area density to the paraelectric layer 31 as oxygen ions to form oxygen vacancies in the oxide layer 33. Oxygen ions are negatively charged and oxygen vacancies are positively charged. This forms a dipole negatively charged on the paraelectric layer 31 side and positively charged on the oxide layer 33 side at an interface between the oxide layer 33 and the paraelectric layer 31.

Moreover, this dipole induces a positive charge to the upper electrode 20 and a negative charge to the lower electrode 10. The electric field formed by the charges induced to the upper electrode 20 and the lower electrode 10 also functions to stabilize the polarization direction of the ferroelectric layer 32.

Both the electric field formed by the dipole and the electric field formed by the charges induced in the upper electrode 20 and the lower electrode 10 also function to stabilize the polarization direction of the ferroelectric layer 32 in the on state. In other words, both the electric field formed by the dipole and the electric field formed by the charges induced in the upper electrode 20 and the lower electrode 10 function to destabilize the polarization direction of the ferroelectric layer 32 in the off state.

Therefore, the polarization direction of the ferroelectric layer 32 in the on state is easily developed, and the polarization direction in the on state is easily retained. This decreases the coercive field (Ec) on the positive side and decreases the set voltage. This also increases the coercive field (Ec') on the negative side and increases the reset voltage.

As described above, according to the third embodiment, the oxide layer 33 is provided in the resistance change layer 30 to form the dipole, making it possible to decrease the set voltage of the FTJ memory and increase the reset voltage, similarly to the first embodiment. This makes it possible to suppress the breakdown of the memory cell MC and enhance the retention characteristic in the on state at the same time. This can achieve an FTJ memory with stable operation.

Fourth Embodiment

The memory device according to a fourth embodiment is different from the first to third embodiments in that the memory cell array has a three-dimensional structure. Accordingly, the description overlapping with the first to third embodiments will be partly omitted.

Figure 12:
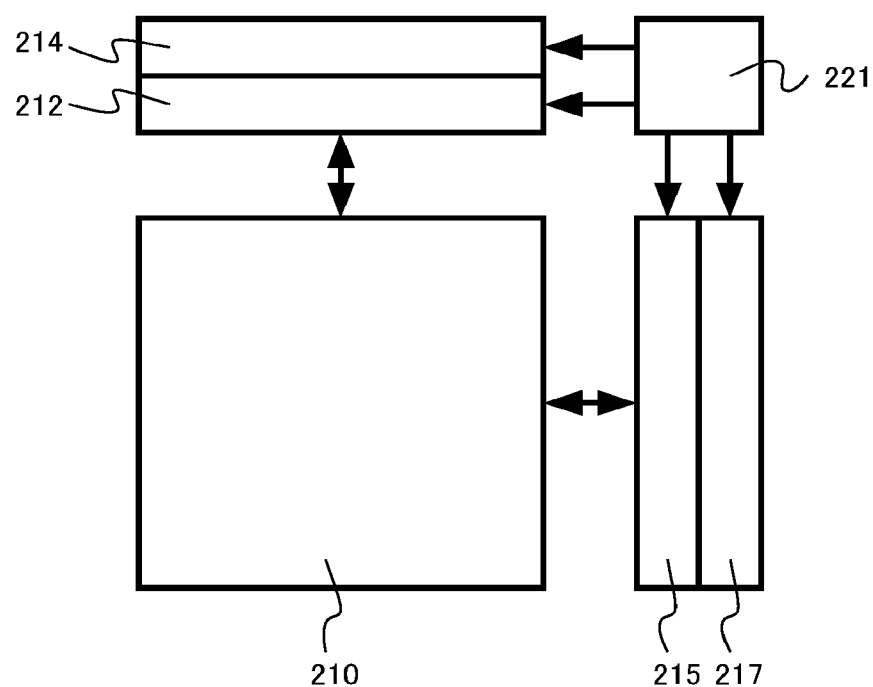
FIG. 12 is a block diagram of a memory device according to a fourth embodiment.
Figure 13:
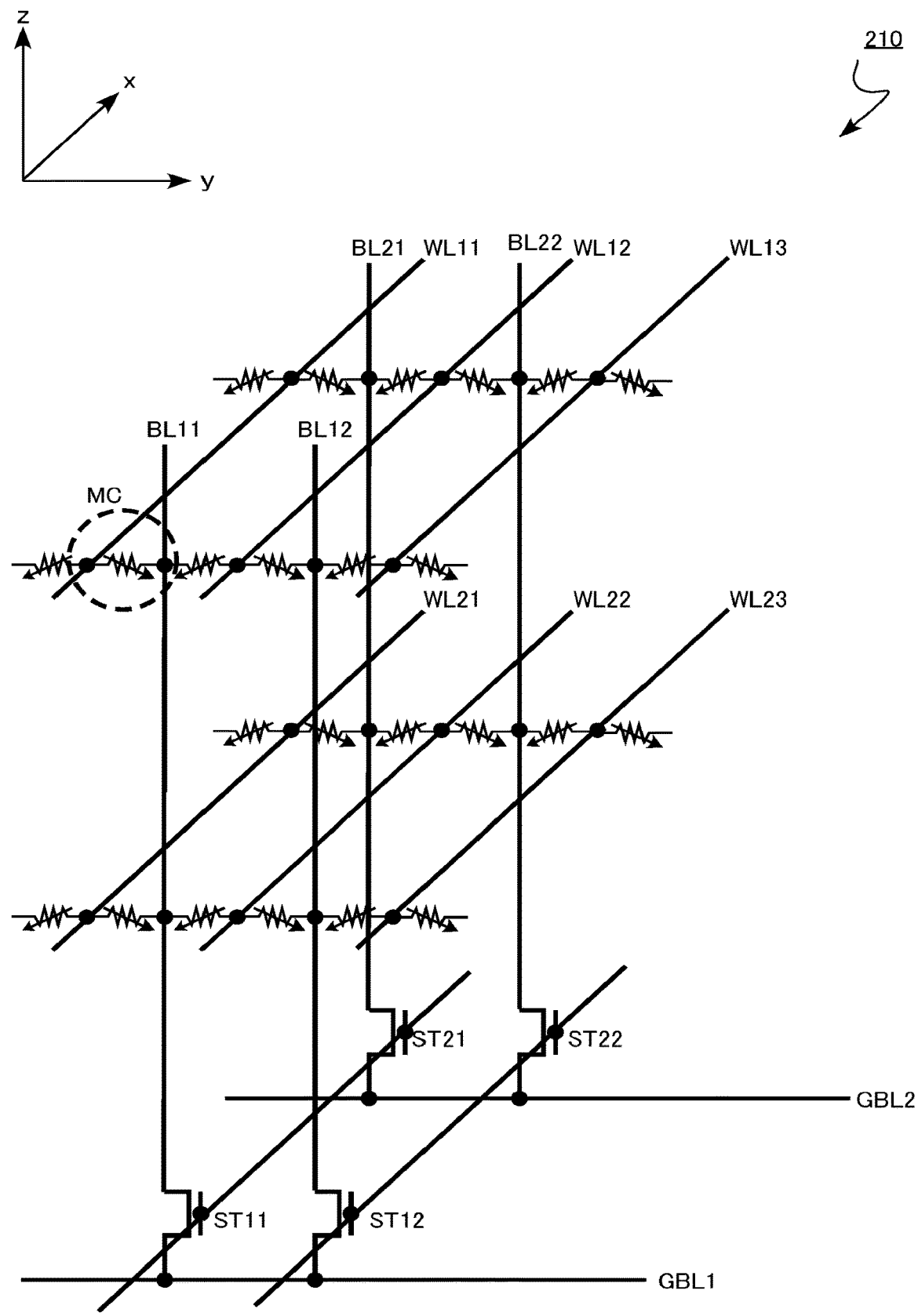
FIG. 13 is an equivalent circuit diagram of a memory cell array of the memory device according to the fourth embodiment.

FIG. 12 is a block diagram of the memory device according to the fourth embodiment. FIG. 13 is an equivalent circuit diagram of the memory cell array of the memory device according to the fourth embodiment. FIG. 13 schematically illustrates a wiring structure in the memory cell array. A memory cell array 210 of according to the fourth embodiment has a three-dimensional structure in which the memory cells MC are three-dimensionally disposed.

As illustrated in FIG. 12, the memory device includes a memory cell array 210, a word line driver circuit 212, a row decoder circuit 214, a sense amplifier circuit 215, a column decoder circuit 217, and a control circuit 221.

In addition, as illustrated in FIG. 13, a plurality of memory cells MC is three-dimensionally disposed in the memory cell array 210. In FIG. 13, a region surrounded by the broken line corresponds to one memory cell MC.

The memory cell array 210 includes, for example, a plurality of word lines WL (WL 11, WL 12, WL 13, WL 21, WL 22, and WL 23) and a plurality of bit lines BL (BL 11, BL 12, BL 21, and BL 22). The word line WL extends in the x-direction. The bit line BL extends in the z-direction. The word line WL intersects the bit line BL vertically. The memory cell MC is disposed at the intersection of the word line WL and the bit line BL.

The plurality of word lines WL is electrically connected to the row decoder circuit 214. The plurality of bit lines BL is connected to the sense amplifier circuit 215. Selection transistors ST (ST 11, ST 21, ST 12, and ST 22) and global bit lines GBL (GBL 1 and GBL 2) are provided between the plurality of bit lines BL and the sense amplifier circuit 215.

The row decoder circuit 214 has a function of selecting the word line WL according to an input row address signal. The word line driver circuit 212 has a function of applying a predetermined voltage to the word line WL selected by the row decoder circuit 214.

The column decoder circuit 217 has a function of selecting the bit line BL according to the input column address signal. The sense amplifier circuit 215 has a function of applying a predetermined voltage to the bit line BL selected by the column decoder circuit 217. The sense amplifier circuit 215 also has a function of detecting and amplifying the current flowing between the selected word line WL and the selected bit line BL.

The control circuit 221 has a function of controlling the word line driver circuit 212, the row decoder circuit 214, the sense amplifier circuit 215, the column decoder circuit 217, and other circuits (not illustrated).

Circuits such as the word line driver circuit 212, the row decoder circuit 214, the sense amplifier circuit 215, the column decoder circuit 217, the control circuit 221, or the like, are constituted with a transistor and a wiring layer using a semiconductor layer (not illustrated).

Figure 14A:
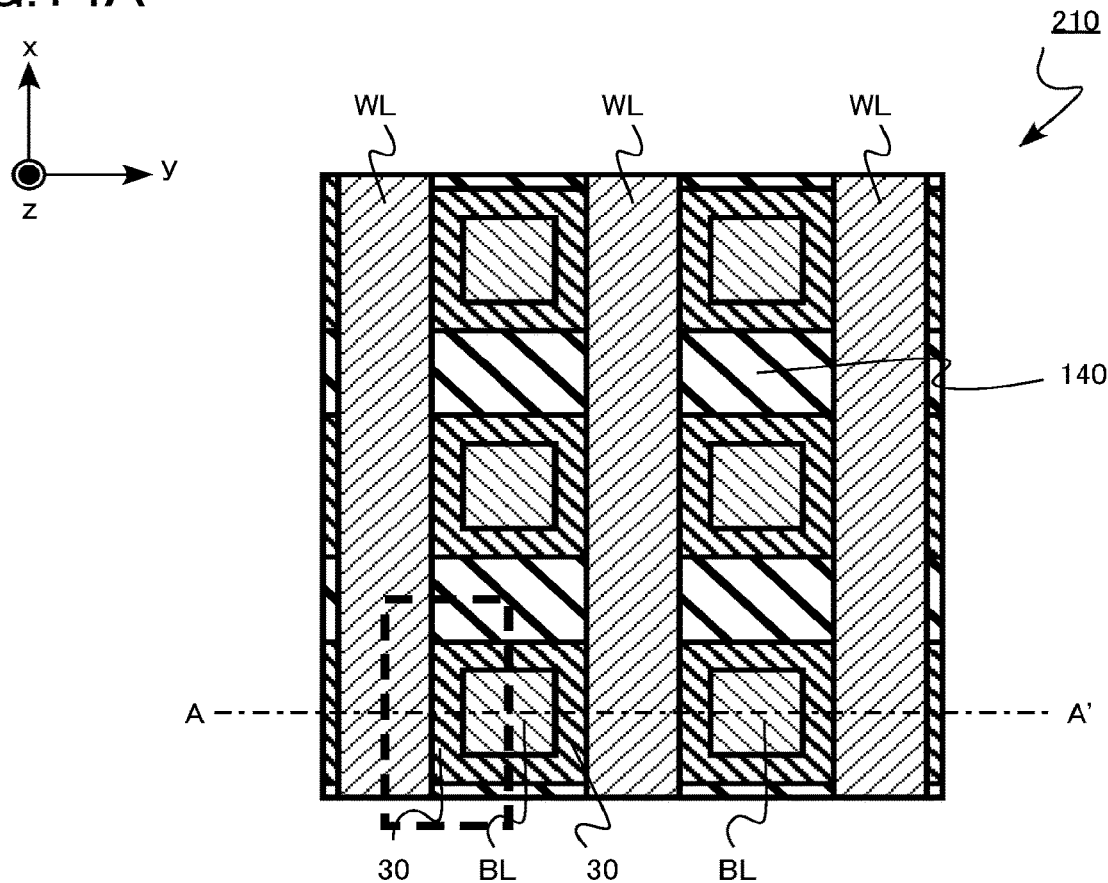
FIGS. 14A and 14B are partial schematic cross-sectional views of the memory cell array of the memory device according to the fourth embodiment.
Figure 14B:
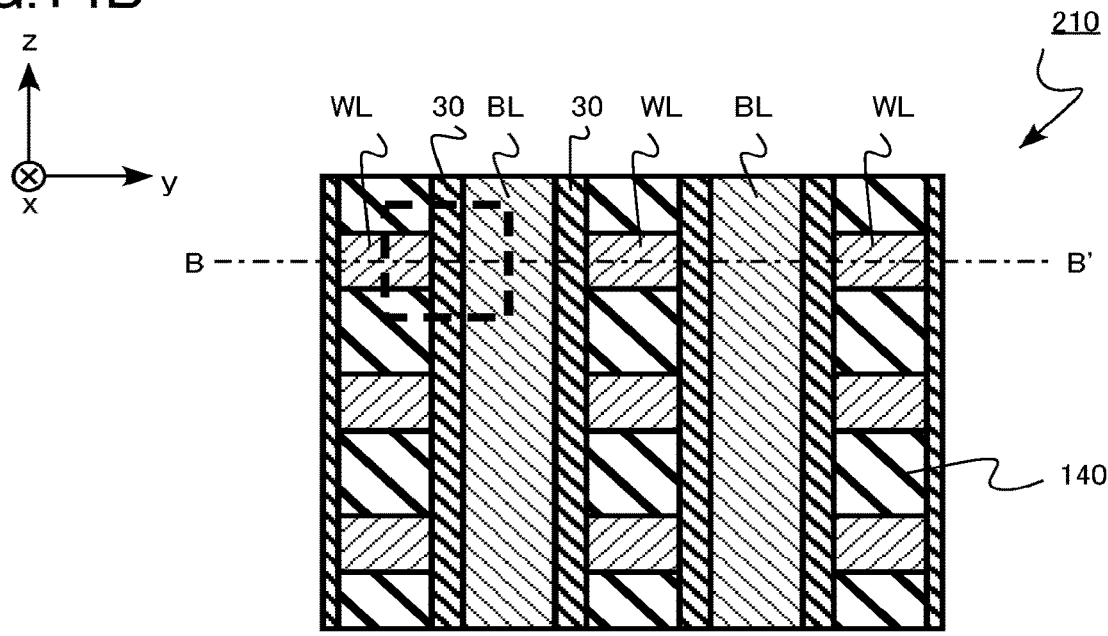

FIGS. 14A and 14B are partial schematic diagrams of the memory cell array 210 of the memory device according to the fourth embodiment. FIG. 14A is an xy cross-sectional view of the memory cell array 210. FIG. 14B is a yz cross-sectional view of the memory cell array 210. FIG. 14A is a cross-sectional view taken along line BB' in FIG. 14B, while FIG. 14B is a cross-sectional view taken along line AA' in FIG. 14A. In each of FIG. 14A and FIG. 14B, the region surrounded by the broken line is one memory cell MC.

The memory cell array 210 includes a plurality of word lines WL (first conductive layers) and a plurality of bit lines BL (second conductive layers). The memory cell array 210 also includes the resistance change layer 30 and an interlayer insulating layer 140.

The word lines WL are alternately stacked in the z-direction with the interlayer insulating layer 140. The word line WL extends in the x-direction.

The word line WL is a metal or a semiconductor, for example. The word line WL is, for example, titanium nitride, tungsten, or a stacked structure of titanium nitride and tungsten.

The bit line BL is provided between the word line WL and the word line WL. The bit line BL extends in the z-direction.

The bit line BL is formed of a metal or a semiconductor, for example. The bit line BL is, for example, titanium nitride, tungsten, or a stacked structure of titanium nitride and tungsten.

The resistance change layer 30 is provided between the word line WL and the bit line BL. A structure similar to the structure of the resistance change layer 30 according to the first to third embodiments is applied to the resistance change layer 30.

According to the fourth embodiment, an FTJ memory that operates stably is achieved similarly to the first to third embodiments. Furthermore, there is provided a three-dimensional structure, making it possible to achieve an effect of enhancing the degree of integration of the resistance change memory.

While the first to third embodiments are exemplary cases where the cross-point structure of the memory cell array 100 is provided on a single layer, it is possible to provide the memory cell array 100 having a three-dimensional structure including a plurality of the memory cell arrays 100 according to the first to third embodiments being stacked.

While certain embodiments have been described, these embodiments have been presented by way of example only, and are not intended to limit the scope of the inventions. Indeed, the memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A memory device comprising:
    a first conductive layer;
    a second conductive layer;
    a ferroelectric layer provided between the first conductive layer and the second conductive layer and containing hafnium oxide;
    a paraelectric layer provided between the first conductive layer and the ferroelectric layer and containing a first oxide; and
    an oxide layer provided between the ferroelectric layer and the second conductive layer, the oxide layer being in contact with the ferroelectric layer, and containing a second oxide having an oxygen area density lower than an oxygen area density of hafnium oxide.

2. The memory device according to claim 1, wherein the first oxide is either silicon oxide or aluminum oxide.

3. The memory device according to claim 1, wherein a work function of the first conductive layer is greater than a work function of the second conductive layer.

4. The memory device according to claim 1, wherein the hafnium oxide contained in the ferroelectric layer includes third orthorhombic hafnium oxide.

5. The memory device according to claim 1, wherein the hafnium oxide contained in the ferroelectric layer contains at least one element selected from the group consisting of silicon (Si), titanium (Ti), zirconium (Zr), aluminum (Al), and yttrium (Y).

6. A memory device comprising:
a first conductive layer;
a second conductive layer;
a ferroelectric layer provided between the first conductive layer and the second conductive layer and containing hafnium oxide;
a paraelectric layer provided between the first conductive layer and the ferroelectric layer and containing a first oxide; and
an oxide layer provided between the first conductive layer and the paraelectric layer, the oxide layer being in contact with the paraelectric layer, and containing a second oxide having an oxygen area density higher than an oxygen area density of the first oxide.

7. The memory device according to claim 6, wherein the first oxide is either silicon oxide or aluminum oxide.

8. The memory device according to claim 6, wherein a work function of the first conductive layer is greater than a work function of the second conductive layer.

9. The memory device according to claim 6, wherein the hafnium oxide contained in the ferroelectric layer includes third orthorhombic hafnium.

10. The memory device according to claim 6, wherein the hafnium oxide contained in the ferroelectric layer contains at least one element selected from the group consisting of silicon (Si), titanium (Ti), zirconium (Zr), aluminum (Al), and yttrium (Y).

11. A memory device comprising:
a first conductive layer;
a second conductive layer;
a ferroelectric layer provided between the first conductive layer and the second conductive layer and containing hafnium oxide;
a paraelectric layer provided between the first conductive layer and the ferroelectric layer and containing a silicon oxide; and
an oxide layer provided between the ferroelectric layer and the second conductive layer, the oxide layer being in contact with the ferroelectric layer, and containing at least one oxide selected from the group consisting of magnesium oxide, silicon oxide, germanium oxide, yttrium oxide, lutetium oxide, lanthanum oxide, and strontium oxide.

12. The memory device according to claim 11, wherein a work function of the first conductive layer is greater than a work function of the second conductive layer.

13. The memory device according to claim 11, wherein the hafnium oxide contained in the ferroelectric layer includes third orthorhombic hafnium oxide.

14. The memory device according to claim 11, wherein the hafnium oxide contained in the ferroelectric layer contains at least one element selected from the group consisting of silicon (Si), titanium (Ti), zirconium (Zr), aluminum (Al), and yttrium (Y).

15. A memory device comprising:
a first conductive layer;
a second conductive layer;
a ferroelectric layer provided between the first conductive layer and the second conductive layer and containing hafnium oxide;
a paraelectric layer provided between the first conductive layer and the ferroelectric layer and containing a silicon oxide; and
an oxide layer provided between the first conductive layer and the paraelectric layer, the oxide layer being in contact with the paraelectric layer, and containing at least one oxide selected from the group consisting of aluminum oxide, titanium oxide, zirconium oxide, hafnium oxide, and magnesium oxide.

16. The memory device according to claim 15, wherein a work function of the first conductive layer is greater than a work function of the second conductive layer.

17. The memory device according to claim 15, wherein the hafnium oxide contained in the ferroelectric layer includes third orthorhombic hafnium oxide.

18. The memory device according to claim 15, wherein the hafnium oxide contained in the ferroelectric layer contains at least one element selected from the group consisting of silicon (Si), titanium (Ti), zirconium (Zr), aluminum (Al), and yttrium (Y).

* * * * *